(12) United States Patent
Derra et al.

(10) Patent No.: US 8,076,655 B2
(45) Date of Patent: Dec. 13, 2011

(54) METHOD OF CLEANING OPTICAL SURFACES OF AN IRRADIATION UNIT IN A TWO-STEP PROCESS

(75) Inventors: Guenther Hans Derra, Aachen (DE); Thomas Kruecken, Aachen (DE); Christof Metzmacher, Aachen (DE); Achim Weber, Aachen (DE); Peter Zink, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 943 days.

(21) Appl. No.: 11/993,048

(22) PCT Filed: Jun. 7, 2006

(86) PCT No.: PCT/IB2006/051814
§ 371 (c)(1),
(2), (4) Date: Dec. 19, 2007

(87) PCT Pub. No.: WO2006/136967
PCT Pub. Date: Dec. 28, 2006

(65) Prior Publication Data
US 2010/0051827 A1    Mar. 4, 2010

(30) Foreign Application Priority Data

Jun. 21, 2005  (EP) .................................... 05105475

(51) Int. Cl.
*G03F 7/20* (2006.01)
*B08B 5/00* (2006.01)

(52) U.S. Cl. .................... 250/492.2; 250/504 R; 134/2; 134/21; 134/26

(58) Field of Classification Search ........................ None
See application file for complete search history.

(56) References Cited

U.S. PATENT DOCUMENTS

| | | | |
|---|---|---|---|
| 6,724,460 B2 | 4/2004 | Van Schaik et al. | |
| 6,772,776 B2 | 8/2004 | Klebanoff et al. | |
| 6,781,685 B2 | 8/2004 | Hamm | |
| 6,859,259 B2* | 2/2005 | Bakker et al. | 355/53 |
| 7,315,346 B2* | 1/2008 | Van Beek et al. | 355/30 |
| 7,750,326 B2* | 7/2010 | Van Herpen et al. | 250/504 R |
| 2004/0007246 A1* | 1/2004 | Chan et al. | 134/1.1 |
| 2004/0011381 A1 | 1/2004 | Klebanoff et al. | |
| 2006/0175558 A1* | 8/2006 | Bakker et al. | 250/492.2 |

FOREIGN PATENT DOCUMENTS

| | | |
|---|---|---|
| EP | 1643310 A1 | 4/2006 |
| WO | 2004104707 A2 | 12/2004 |
| WO | 2006011105 A2 | 2/2006 |

* cited by examiner

Primary Examiner — Jack Berman

(57) ABSTRACT

The present invention provides a method of cleaning optical surfaces in an irradiation unit in order to remove contaminations deposited on said optical surfaces. The method includes a cleaning step in which a first gas or gas mixture is brought into contact with said optical surfaces thereby forming a volatile compound with a first portion of said contaminations. In an operation pause of the irradiation unit prior to the cleaning step, a pretreatment step is performed, in which a second gas or gas mixture is brought into contact with said optical surfaces. Said second gas or gas mixture is selected to react with a second portion of said contaminations different from said first portion to form a reaction product, which is able to form a volatile compound with said first gas or gas mixture.

19 Claims, 10 Drawing Sheets

Figure 1:
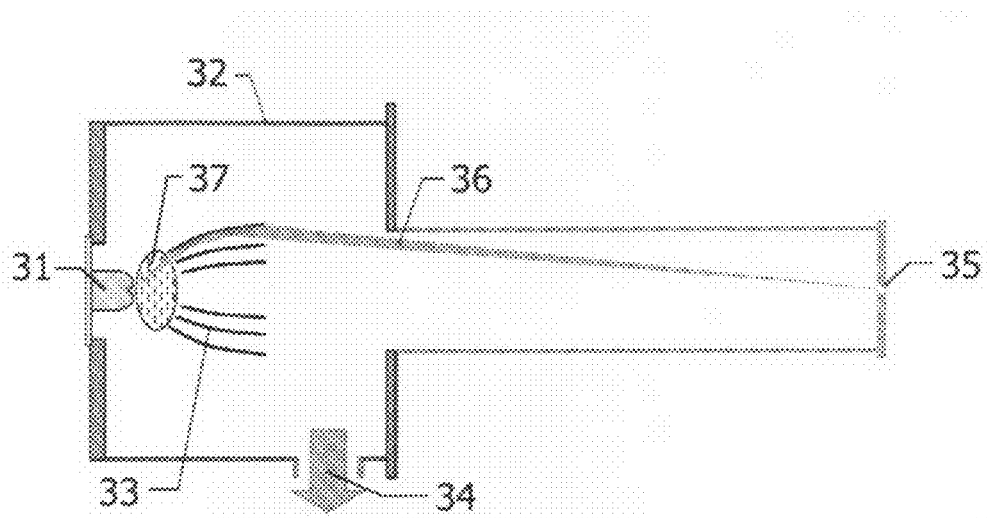

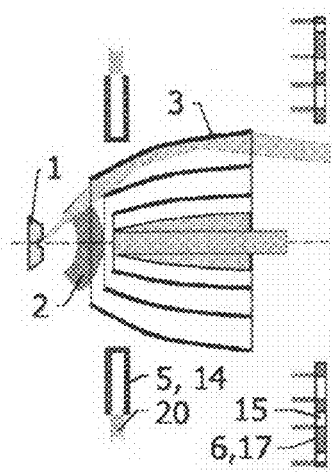
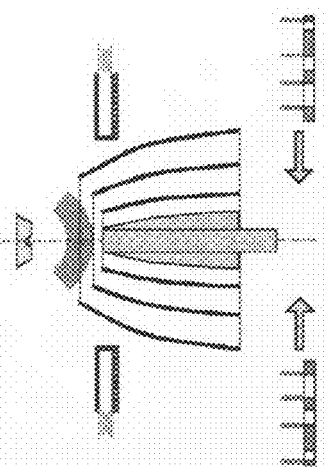
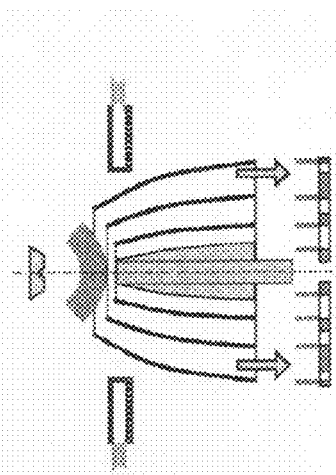
FIG. 19a     FIG. 19b     FIG. 19c
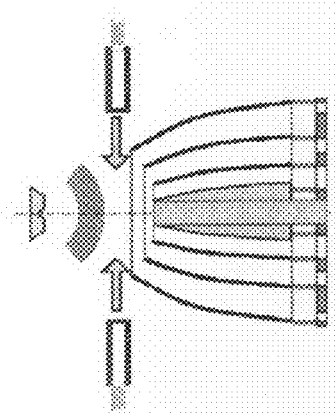
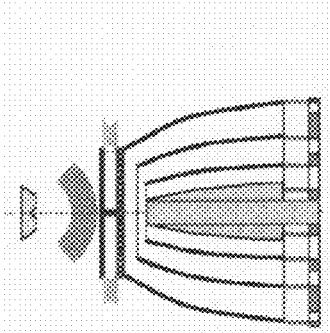
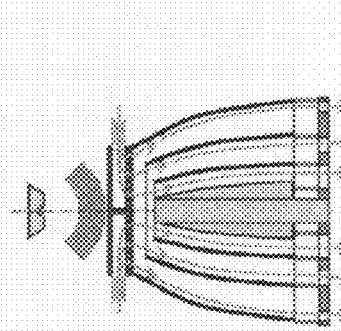
FIG. 19d     FIG. 19e     FIG. 19f

METHOD OF CLEANING OPTICAL SURFACES OF AN IRRADIATION UNIT IN A TWO-STEP PROCESS

The present invention relates to a method of cleaning optical surfaces in an irradiation unit in order to remove contaminations deposited on said optical surfaces, in particular in an irradiation unit for EUV-radiation and/or soft X-rays, the method including a cleaning step in which a first gas or gas mixture is brought into contact with said optical surfaces thereby forming a volatile compound with a first portion of said contaminations.

In the field of optical lithography for semiconductor industry complex optics are used in order to ensure the required imaging quality. This applies in particular to EUV-lithography, i.e. lithography with extreme ultraviolet (EUV) radiation, in which grazing incidence mirrors and multilayer mirrors are arranged in a vacuum chamber between the radiation source and the wafer substrate to be irradiated. For both types of mirrors an extremely high surface quality with a micro roughness of approximately 1 nm or more is required. Optical lenses are not usable due to the high absorbance of the materials in this wavelength region. For the same reason it is not possible to arrange windows between the radiation source and the optical components, so that the radiation source, the optical components, the lithographic mask and the substrate form a continuous vacuum system without completely separating elements in between.

In this continuous vacuum system, however, gases and particles from the radiation source can move to the optical components. The resulting contaminations on the surfaces of these optical components reduce the optical quality of the whole optical system.

Radiation sources used for EUV-lithography today are gas discharge plasmas or laser plasmas. In both cases a very hot plasma is generated, in which multiple ionized ions emit radiation in the short wavelength EUV-region. In gas discharge plasmas the plasma is generated and heated by the electrical energy of the discharge. In laser plasmas a laser beam of high power is focused on a gaseous, liquid or solid target for generation of the hot plasma.

Substances emitting radiation in the EUV-region, in particular at a wavelength of 13.5 nm which is favorable for the use with multilayer mirrors, are xenon, lithium, tin, indium, antimony and tellurium. While xenon as a noble gas is highly volatile, most of the metallic substances are low volatile substances. These substances can move from the radiation source to the optical components and condense on the optical surfaces. Non-volatile substances can also be released by erosion of the electrodes during the discharge or through the nozzles necessary to form the targets for generating the laser plasma. Material released from the radiation source and moving in the direction of the optical components is called debris.

Debris layers can deposit on the optical components reducing the quality of these components. Already very thin deposited layers of only 1 nm significantly reduce the reflected intensity of the EUV-radiation due to absorption losses on the mirrors. In addition to the degradation during operation time caused by the growing layers also a spatial inhomogeneity arises, since the material deposition on the mirrors is not constant over the mirror surface.

The optical surfaces of optical components of such an irradiation unit, in particular the optical surfaces of the collector mirror of an EUV irradiation unit, have to be cleaned repeatedly in order to remove the contaminations deposited on the optical surfaces. FIG. 1 schematically shows a typical layout of one part of an EUV-lithography system. This part basically consists of the radiation source 31 and a collector 33 in a vacuum vessel 32. The radiation emitted from the radiation source 31 is collected by the reflective collector 33 and focused on an intermediate focus 35. At the position of this intermediate focus 35 an aperture connects this first part with a second part of the irradiation unit. In this second part, not shown in FIG. 1, further optical components are arranged to guide the radiation from the intermediate focus 35 to the mask and the wafer substrate. In most EUV-lithography systems means 37 for debris mitigation are arranged between the radiation source and the collector. In order to achieve economical operation of the lithography system the debris should be reduced by at least seven orders of magnitude. Such a high mitigation however, is very difficult on the short distance between the radiation source and the collector and up to now could not be experimentally demonstrated. Therefore, there is a great need for suitable cleaning methods in order to extend the lifetime of the collector.

WO2004/104707 A2 describes a method and a device for cleaning at least one optical component of an irradiation unit, in particular for EUV-radiation or soft X-rays. In the described method at least one gas is brought into contact with the optical surfaces in a cleaning step thereby forming volatile compounds with a portion of the contaminations deposited on said optical surfaces. This cleaning step can be performed online during the operation of the irradiation unit or offline in an operation pause of the irradiation unit. As suitable gases for this cleaning step the document proposes hydrogen containing substances, halogens, inter-halogen compounds and halogen containing compounds. By additionally irradiating these gases with UV or EUV-radiation, radicals are generated which enhance the reaction rates with the contaminations. The prior art document also discloses the delivery of additional gases in order to passivate components within the vacuum vessel, so that they get protected against the cleaning gas.

It is an object of the present invention to further improve such a method of cleaning optical surfaces in an irradiation unit in order to achieve an improved cleaning result.

The object is achieved with the method of present claim 1. Claims 21 and 25 relate to irradiation units for carrying out the method of claim 1. Advantageous embodiments of the method and irradiation units are subject of the dependent claims and are furthermore disclosed in the following description and examples for carrying out the invention.

The present method includes a cleaning step in which a first gas or gas mixture, in the following also called cleaning gas, is brought into contact with the optical surfaces thereby forming a volatile compound, preferably a highly volatile compound, with a first portion of said contaminations. The method is characterized by a pretreatment step which is performed prior to the cleaning step. In this pretreatment step a second gas or gas mixture, in the following also called pretreatment gas, is brought into contact with said optical surfaces, wherein said second gas or gas mixture is selected to react with a second portion of said contaminations different from said first portion to form a reaction product which itself forms a volatile compound, preferably a highly volatile compound, when coming into contact with said first gas or gas mixture. In the present patent application the terms "first gas or gas mixture" and "second gas or gas mixture" do not indicate any time order of supplying these gases, but are only used to distinguish between the cleaning gas and the pretreatment gas.

The present invention is based on the experience that with the cleaning step not all of the contaminations can be totally removed since not all of the contaminations form a volatile compound with the cleaning gas. Therefore, only a first portion of the contaminations can be removed during the cleaning step of the state of the art described in the introductory portion of the present description. With the pretreatment step of the present invention, however, a second portion of the contaminations which normally does not form volatile or highly volatile compounds with the cleaning gas of the cleaning step is converted into compounds which later on in the cleaning step form such volatile or highly volatile compounds with the cleaning gas. This is achieved by bringing a second gas or gas mixture into contact with the optical surfaces prior to the cleaning step, said second gas or gas mixture being selected such that the above conversion occurs. With this measure it is possible to increase the portion of contaminations on the optical surfaces which can be removed during the cleaning step by forming volatile or highly volatile compounds with the cleaning gas. This pretreatment step is performed during an operation pause of the irradiation unit, preferably during an operation pause of the radiation source.

Typical contaminations on the optical surfaces in EUV-radiation or soft X-ray irradiation units are inorganic materials, in particular metals like tin, tellurium, indium, lithium, tungsten, molybdenum or antimony, which are released from the hot plasma With the present method when selecting appropriate pretreatment and cleaning gases it is possible to remove the contaminations to a high degree. Typical cleaning gases for the cleaning step are hydrogen containing substances and/or halogens, inter-halogen compounds (i.e. compounds containing different halogens) and/or halogen containing compounds. These cleaning gases can be the same as disclosed in the WO 2004/104707 A2 already mentioned. This document is included herein by reference with respect to a detailed description of the cleaning step of the present invention.

Gases suitable as pretreatment gases for the pretreatment step of the present method are for example active (atomic) hydrogen, i.e. hydrogen radicals, molecular hydrogen, hydrogen containing gases like $NH_3$ or $N_2H_3$ or other gases or vapors having a reducing effect. Nevertheless, also other gases or vapors can be used which are suitable to achieve the conversion of a portion of the contaminations, which normally does not form volatile or highly volatile compounds with the cleaning gas, to compounds which form volatile or highly volatile compounds with the cleaning gas.

The present method allows the repeated cleaning of the optical surfaces of optical components, for example of collector surfaces in an EUV-radiation or soft X-ray irradiation unit, to a high degree. This allows for a timely and spatially homogenous imaging, in particular a timely and spatially homogenous EUV irradiation of the mask and the wafer in an EUV irradiation unit. Moreover, with the present method a higher lifetime of the optical components in such a unit is achieved. Although the present method and irradiation unit are described here with reference to EUV-radiation or soft X-ray irradiation units, it is evident that the same cleaning effects can also be achieved when cleaning optical surfaces of irradiation units emitting radiation in other wavelength ranges.

In particular in the pretreatment step but in the later cleaning step as well it is advantageous, if the pretreatment and cleaning gases coming into contact with the optical surfaces include a fraction of radicals. It is, however, difficult to transport radicals to the optical surfaces since radicals tend to react very rapidly with other substances present in the system, for example with the wall or structural materials. In the present method several techniques are proposed which overcome this difficulty.

One possibility for generating radicals from the delivered gases in the pretreatment and/or the cleaning step according to one embodiment of the present method is the arrangement of hot surfaces, preferably metal surfaces, e.g. hot filaments, in the gas path of the delivered gases. This solution is implemented in the irradiation unit of the present invention which comprises heatable surfaces, preferably metal elements, e.g. filaments, which are preferably arranged outside the optical path of the radiation generated in the radiation source.

If theses hot surfaces are passed by the gases, the molecules such as for example $H_2$ can be activated by these hot surfaces thereby forming the radicals, for example atomic hydrogen. The surfaces, in particular the heatable elements providing these surfaces, are made for example of tungsten, molybdenum or tantalum. In order to ensure the contact of these radicals with the optical surfaces, the heatable surfaces are arranged close to these optical surfaces in the flow path of the delivered gases. In order to avoid a negative influence on the normal operation of the irradiation unit, the heatable elements can be made of thin wires, preferably with diameters $\leqq 1$ mm, which do not perturb the optical path of the generated radiation and/or the heatable elements are arranged in optical shadow regions of components of the irradiation unit, as for example of portions of the means for debris mitigation, in particular in the shadow of the single foils of such means, or in a shadow of the collector shells or of the shell mounting structures. In this case, the heatable elements can remain stationary in the irradiation unit all the time and there is no need to remove them between the cleaning and pretreatment steps. The same applies if the heatable elements are arranged in other positions outside the optical path of the irradiation unit, such as for example at the small front sides of the collector shells.

Another possibility is to mount the heatable elements on mechanical closing elements of the irradiation unit which are used to separate the first part of an EUV irradiation unit from the second part or to separate the collector region from the region of the radiation source. The heatable elements can also be arranged in the inlet tubes for the delivered gases.

It should be noted, however, that the transport of radicals through tubes causes problems, since radicals chemically react with the wall materials, incorporate into the wall and recombine on the wall surface. This leads to a strong decrease in radical density. In this context, tubes of a metallic material comprise a very high loss coefficient for radicals. In the present case, the inlet tubes are preferably chosen of a material having a low loss coefficient for radicals and allowing the transport of radicals over a significantly longer distance as for example metallic tubes. Advantageous materials to this end are glass or ceramics. With such tubes extending close to the optical surfaces the radicals can be brought close to these surfaces.

Another possibility of generating radicals in the present method is the use of discharges. In this context dielectric barrier discharges, capacitively or inductively exited glow discharges by high frequency or microwaves as well as spray discharges by use of special electrodes with tip structures can be generated. The necessary electrodes or exiting coils are preferably arranged at the same positions as the heatable elements in the previously described technique in order to avoid any negative influence on the normal operation of the irradiation unit.

A further possibility to generate the radicals in the present method is the use of UV radiation applied to the gases in the vacuum chamber. The UV lamps can be arranged in such a manner that the UV radiation impinges directly on the optical surfaces, so that the radicals are generated near or on these optical surfaces. Such an UV lamp, for example, can be arranged in the region of the intermediate focus of the radiation generated by the radiation source between the first part and the second part of this unit. The generation of the radicals can be supported by additional phosphor or scintillator layers placed on the back sides of the collector shells or on other parts of components in the irradiation unit which are not used for the guidance of the generated radiation. In this case the UV lamps are arranged to illuminate the additional layers.

It goes without saying that the present method is not dependent on the details of generation of radicals in order to support the cleaning of the optical surfaces.

In order to ensure that the pretreatment and/or cleaning gases, in particular the radicals, reach the optical components and are not converted by chemical reactions or recombination on the way to these components, one or several of the following measures can be applied.

One of these measures is to maintain a continuous flow of the gases through the vacuum chamber. A fast flow of the gases ensures that the gases reach all necessary portions of the vacuum chamber prior to be diffused by the walls of the chamber.

A second measure is to use suitable materials for the delivery tubes or for an inside coating of these delivery tubes. Such materials can be for example glass, silica, ceramic, oxide, nitride, carbide, silicate, sulfate or other materials with a low loss coefficient for radicals and which are inert against specific pretreatment and cleaning gases.

A third measure is the mixture of the pretreatment and/or cleaning gases with inert gases in order to reduce the diffusion of the reactive gases to the chamber walls. Examples for such inert gases are Ar, He, Xe, Kr or $N_2$.

A fourth measure is the special arrangement for guiding the gases close to the optical components. This can be achieved with inert delivery tubes which extend close to the optical surfaces, preferably in the optical shadow of the optical components. It is also possible to use one or several mobile effusion or distribution units which can be brought very close to the optical surfaces and removed after the corresponding pretreatment or cleaning step. In a further embodiment, the outlet openings for the gases are integrated in the optical components, for example by providing these components with holes or pores, or by dividing the optical components into several parts in order to generate gaps for bringing in the gases. The effusion or distribution units can also be mounted on the mechanical closing elements which already have been described in connection with the heatable elements.

In the pretreatment and the cleaning step of the present method, the optical surfaces should be treated as homogeneously as possible with respect to the spatial distribution of the gases. The geometry of the optical components, however, can cause large and small flow resistances which lead to an inhomogeneous distribution of the gases. This applies for example to the collector mirrors of EUV irradiation systems. Such a collector mirror normally comprises several shells with small gaps in between. The size of the gaps can vary from shell to shell resulting in different flow resistances of the individual gaps. In order to overcome this problem, the present method proposes the use of mechanical means to adapt the gas flow through the individual collector gaps by providing different flow cross sections for gaps of different sizes. These mechanical means, also called distribution unit, are arranged at the inlet or outlet of the collector mirror with respect to the induced gas flow, i.e. on the side directed towards the radiation source and/or on the side directed towards the second part of the irradiation unit. Examples for this distribution unit are shown with reference to the embodiments in the last portion of the present description.

When applying the present method in an EUV irradiation system, the following steps are performed, some of them optional. Normal operation of the EUV-irradiation unit is performed until a specific amount of contamination of the mirrors by debris is detected. For the control of the mirror contamination optical sensors as for example photodiodes or CCD-cameras with EUV-filters can be used. If the reflectivity measured by these sensors falls under a preset limit, the following pretreatment and cleaning steps are started.

First, the part of the irradiation unit that has to be cleaned, i.e. the cleaning volume, is isolated by mechanical closing elements. The mechanical closing elements preferably completely separate the EUV-collector from the EUV-radiation source, from parts of the debris mitigation system and from the optical components of the second part of the irradiation unit. It is also possible to transport the EUV-collector in a special cleaning part of the system for the pretreatment and cleaning step.

After the separation of the cleaning volume, the pretreatment step is performed as already described in the previous portion of the description. The same applies to the cleaning step following the pretreatment step. The gases and volatile or highly volatile compounds are pumped out during and/or after the cleaning step or each of theses steps. After the cleaning step residues still remaining on the mirrors can optionally be removed from the optical surfaces. Depending on these residues this can be achieved by different measures, for example a treatment with radicals like atomic hydrogen or with molecular hydrogen. With this treatment halogen residues can be removed and metallic oxides can be reduced to metals. By applying molecular hydrogen, the optical surfaces get additionally prepared, so that debris materials which contaminate these surfaces in the following normal operation of the irradiation source are not oxidized on these surfaces. The molecular hydrogen is incorporated in the surface material of the optical and other components in this treatment step and remains there in order to inhibit the oxidation of materials deposited later on. With this measure, the pretreatment step during the next cleaning cycle is supported, since less contaminations have to be reduced.

A further possible measure is the transformation of EUV-absorbing compounds as for example Ruthenium iodide in less absorbing Ruthenium oxide by applying oxygen or oxidizing gases. Apart from oxygen also other gases, e. g. gases containing nitrogen, carbon or other elements, can be used, which cause such a transformation of the absorbing compounds in more stable and less absorbing compounds.

A further optional step is the final cleaning of the volume containing the cleaned optical components. This final cleaning step ensures that reaction products and residues of reaction gases are no more present in this volume. To this end, residues like metal halide compounds are removed from this volume. For the desorption of solid residues on the surfaces of the volume and for pumping out such residues the following measures can be applied. The desorption of this residues can be supported by heating of the components, for example also by use of additional radiation sources like infrared radiators. The pumping out of the residues can also be improved by flushing the volume with inert gas.

A further possible measure is to operate the EUV-source in order to effectively desorb the residues by the emitted photons and the resulting photoelectrons which can then be pumped out. When this measure is applied, a mechanical closing element, if any, between the radiation source and the volume containing the cleaned optical surfaces is opened, wherein the closing element separating the volume from the second part of the irradiation unit remains closed. In operating the EUV-source for this purpose the power of the source can also be increased compared to the normal operation in order to use the heating effect of this radiation directly to desorb the residues from the optical components.

After these steps, the normal operation can be restarted. In this regular operation it is possible to additionally use oxygen getters and special cooling traps, which are arranged in the region of the collector, in order to additionally inhibit the oxidation of deposited debris material.

In the present description and claims the word "comprising" does not exclude other elements or steps and neither does "a" or "an" exclude a plurality. Also any reference signs in the claims shall not be construed as limiting the scope of these claims.

Figure 2:
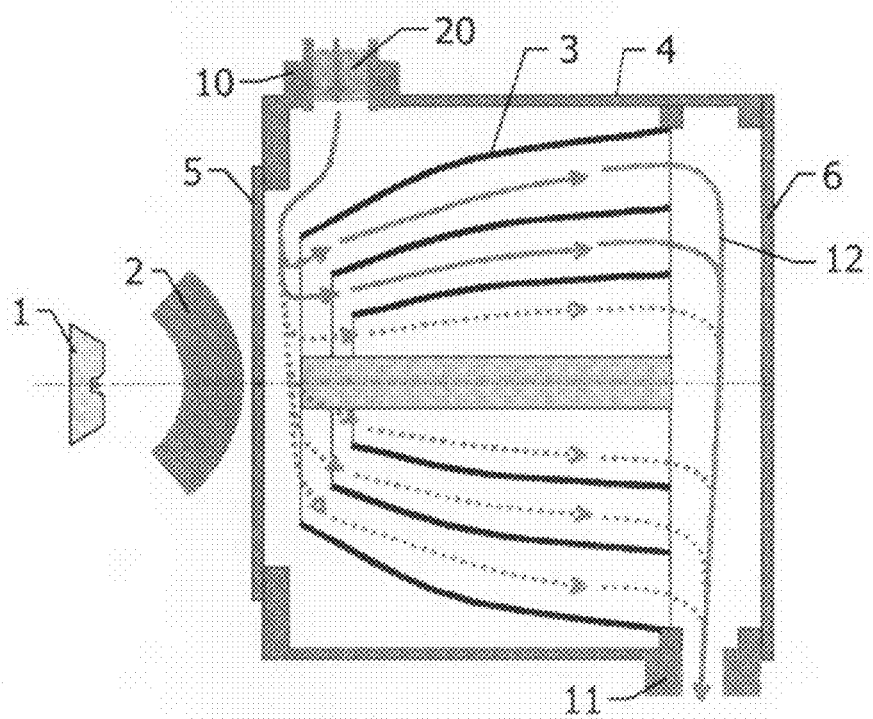
Figure 3:
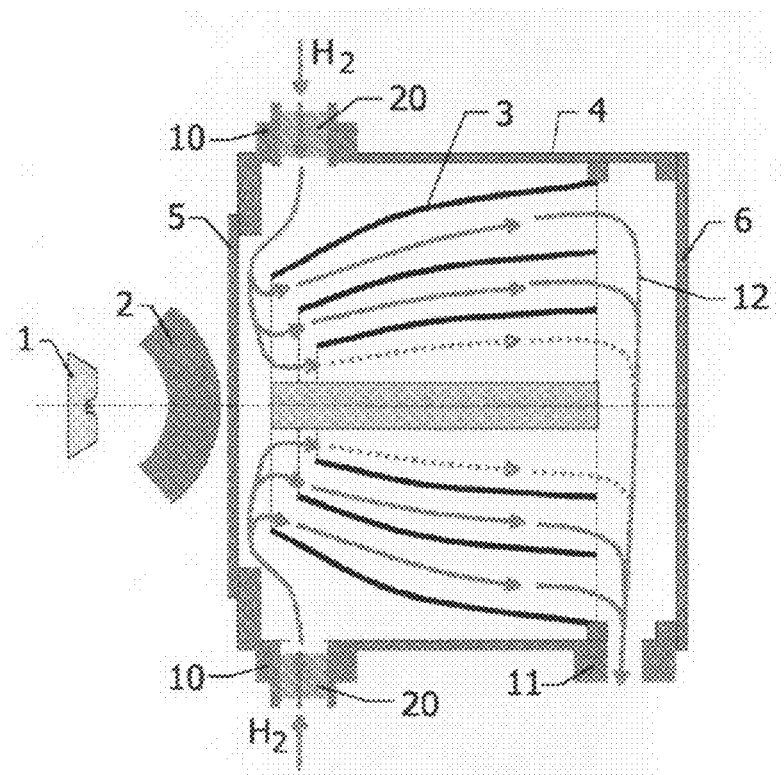
Figure 4:
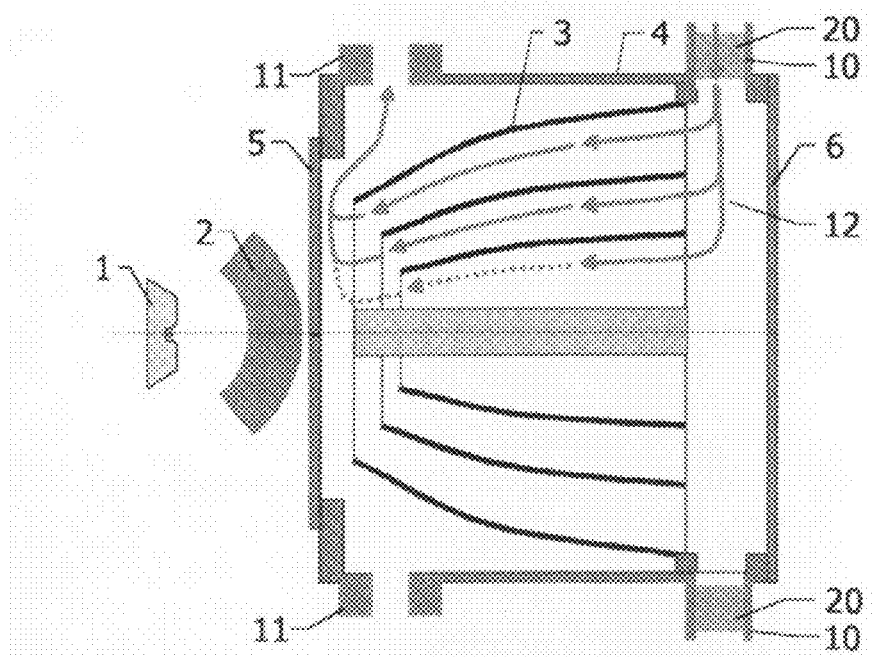
Figure 5:
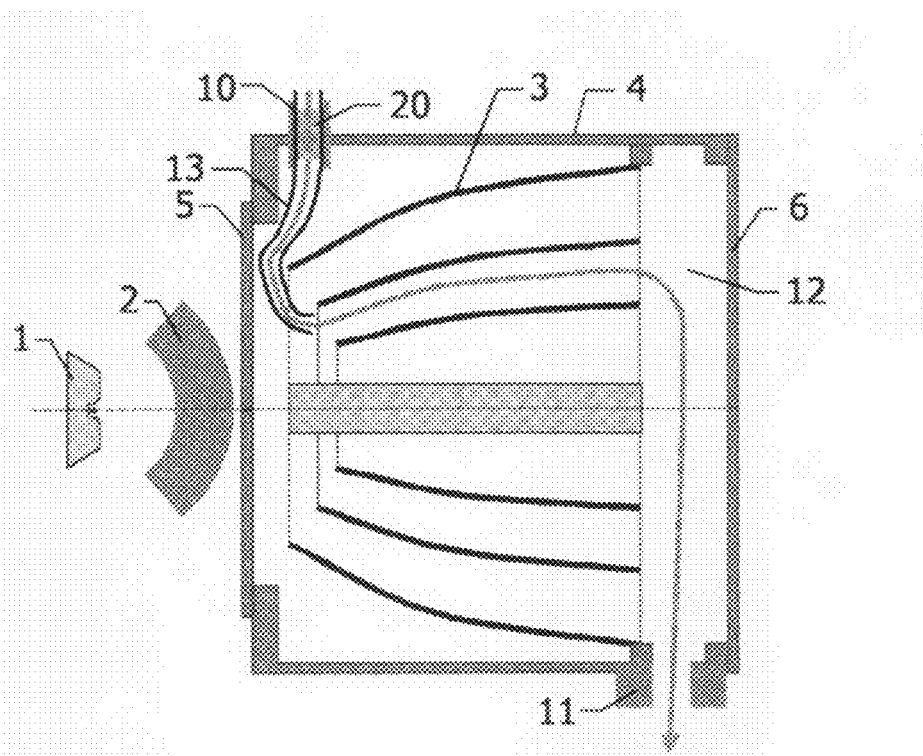
Figure 6:
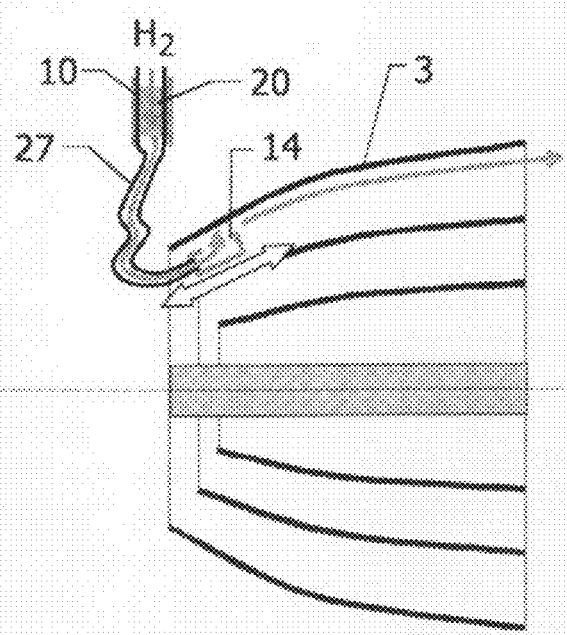
Figure 7:
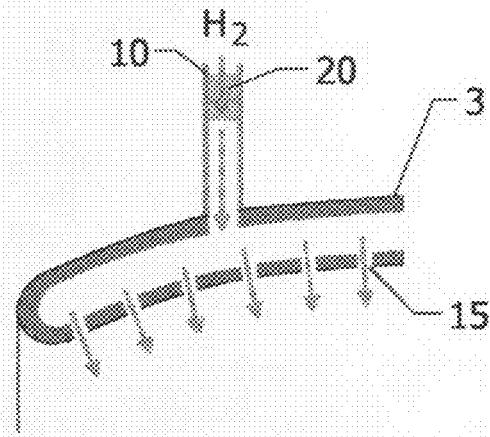
Figure 8:
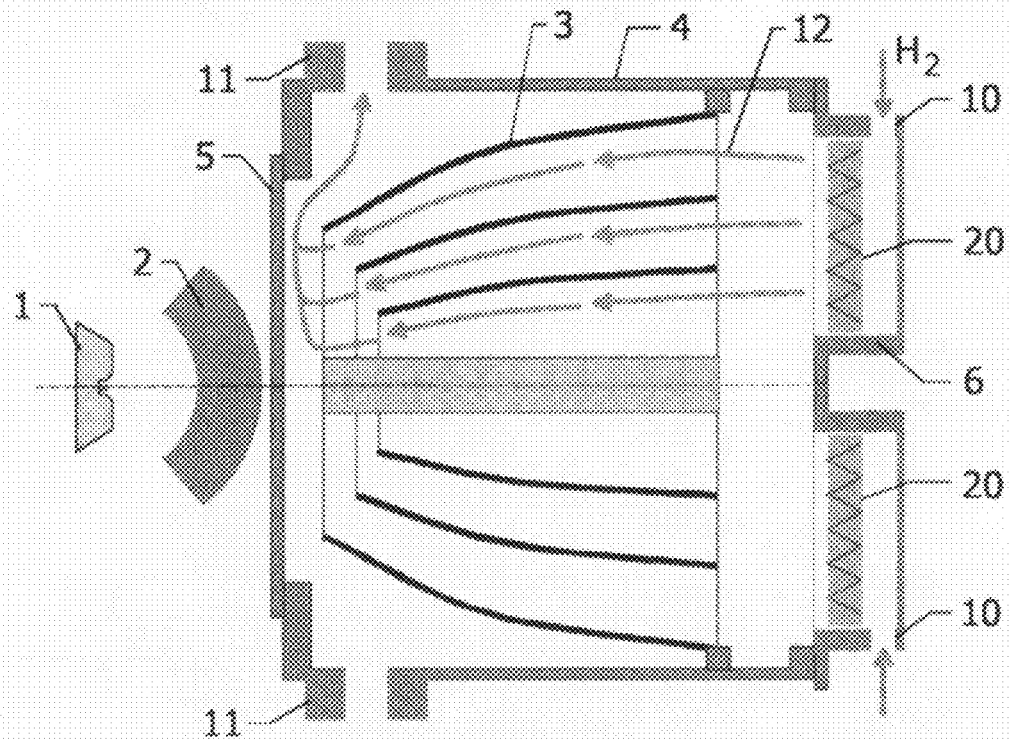
Figure 9:
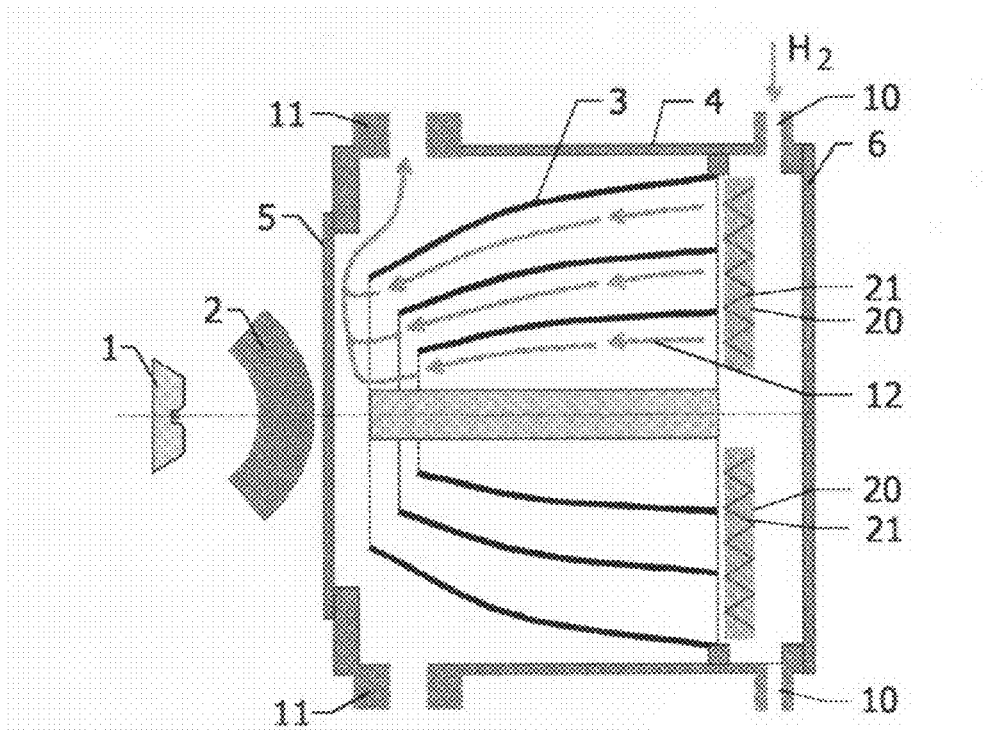
Figure 10:
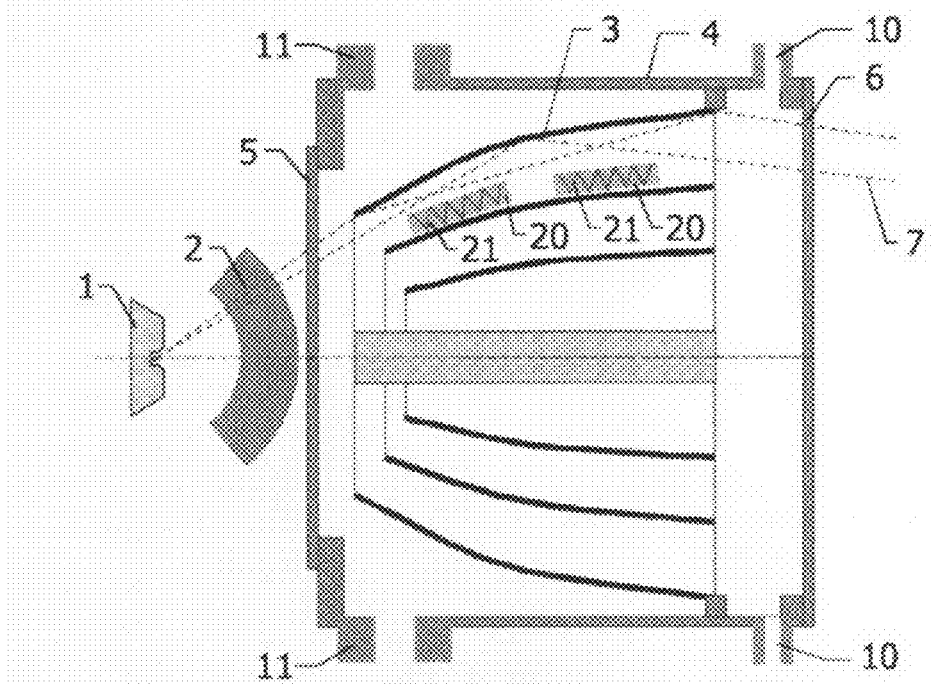
Figure 11:
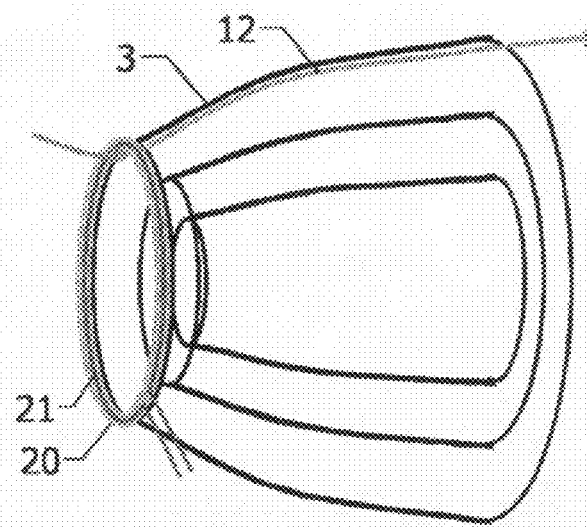
Figure 12:
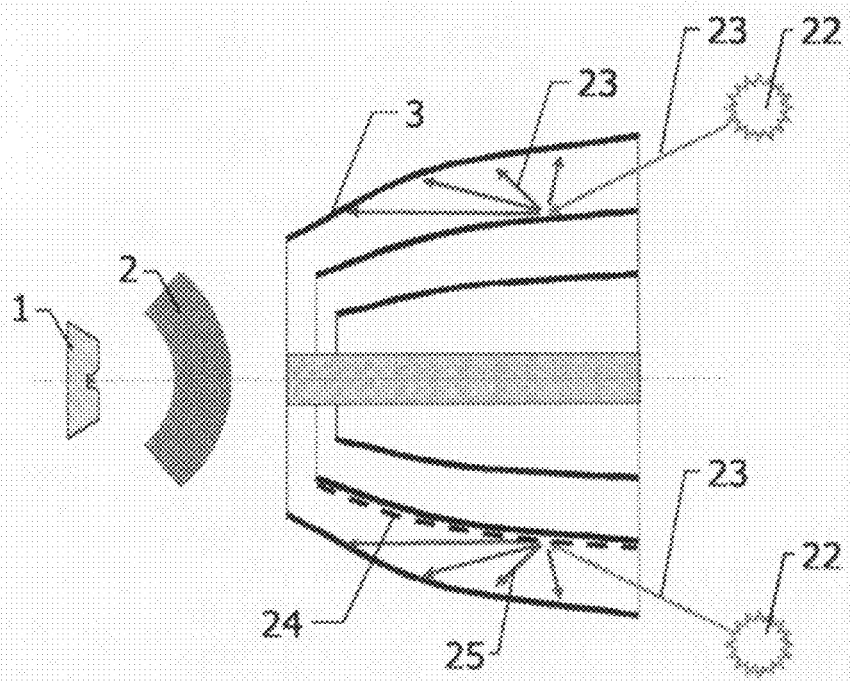
Figure 13:
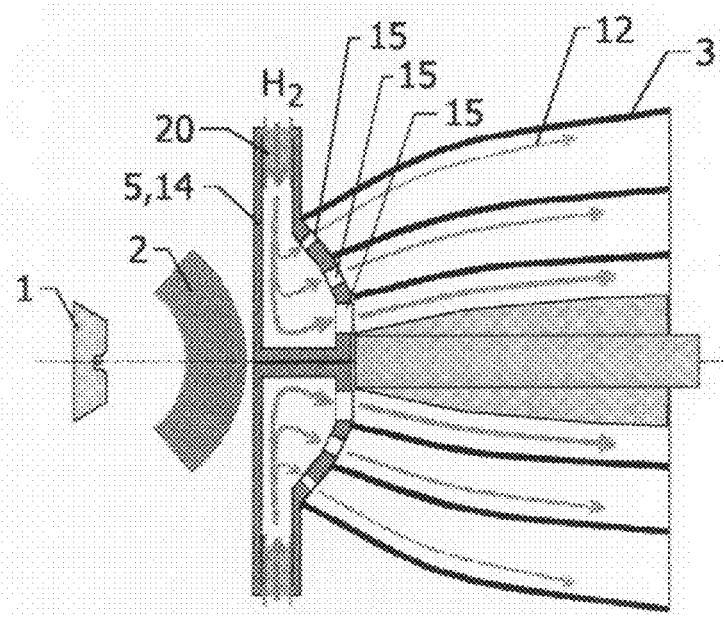
Figure 14:
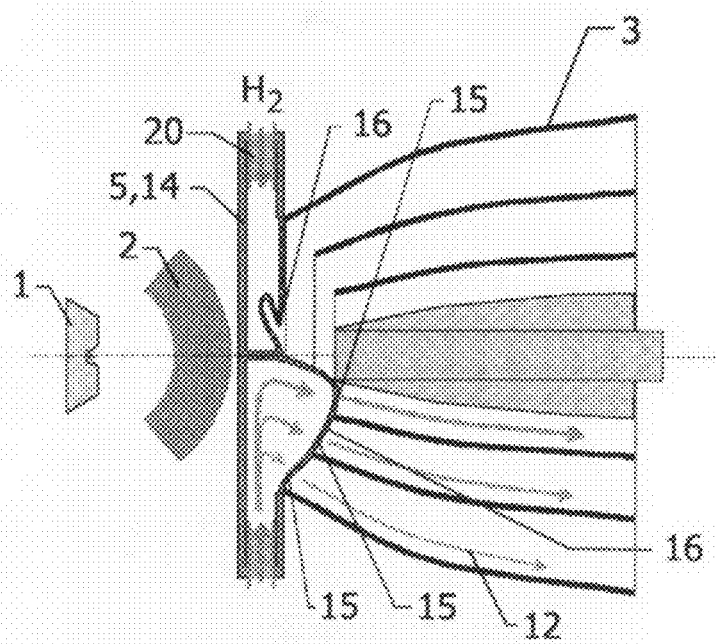
Figure 15:
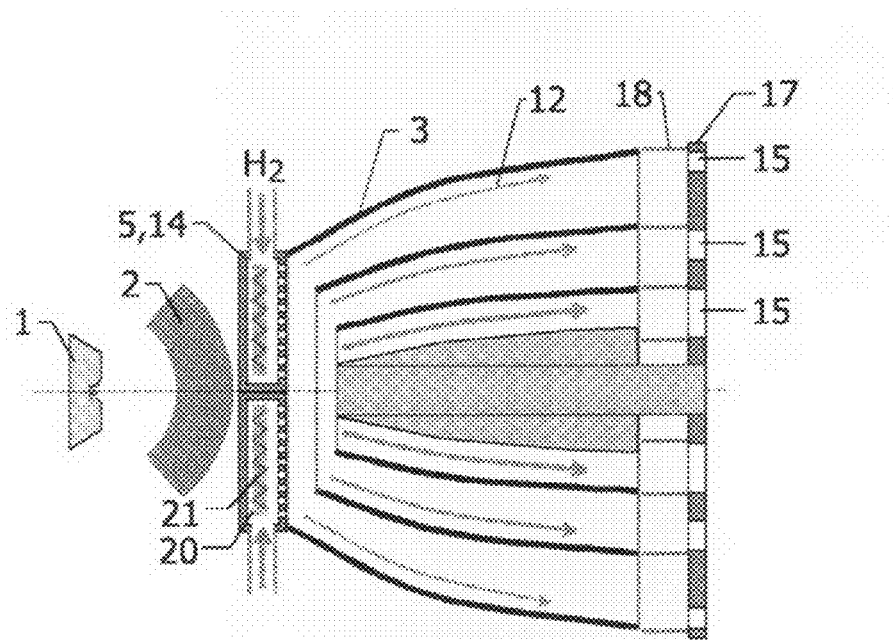
Figure 16:
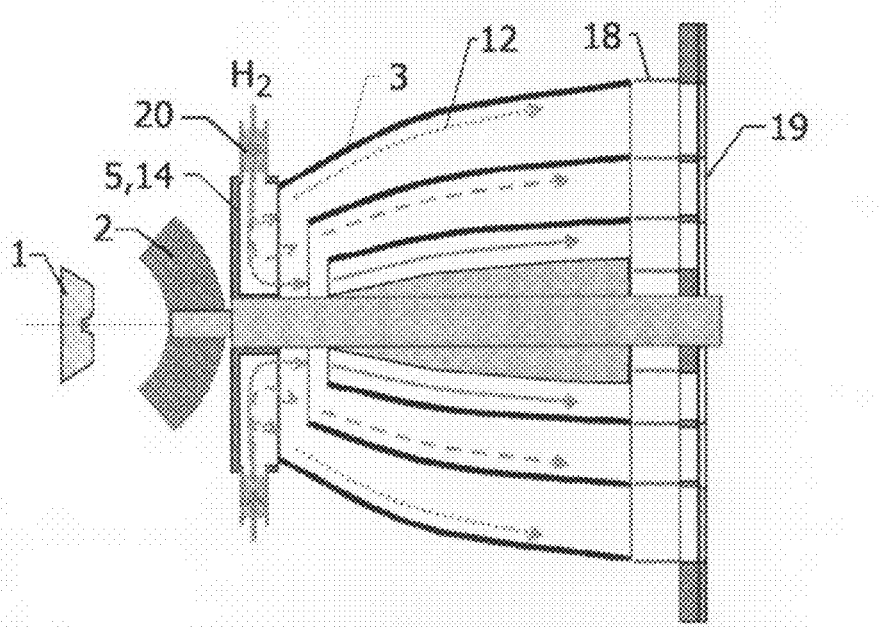
Figure 17:
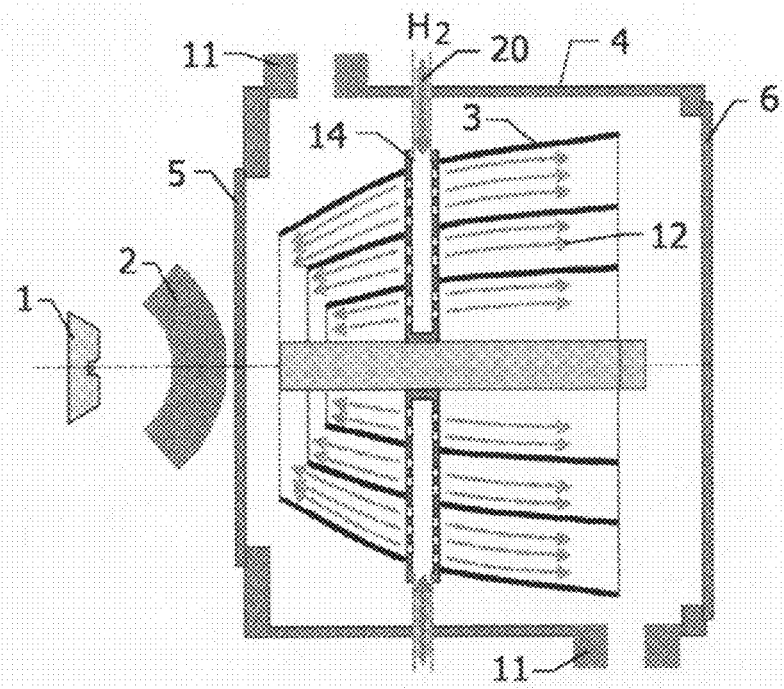
Figure 18:
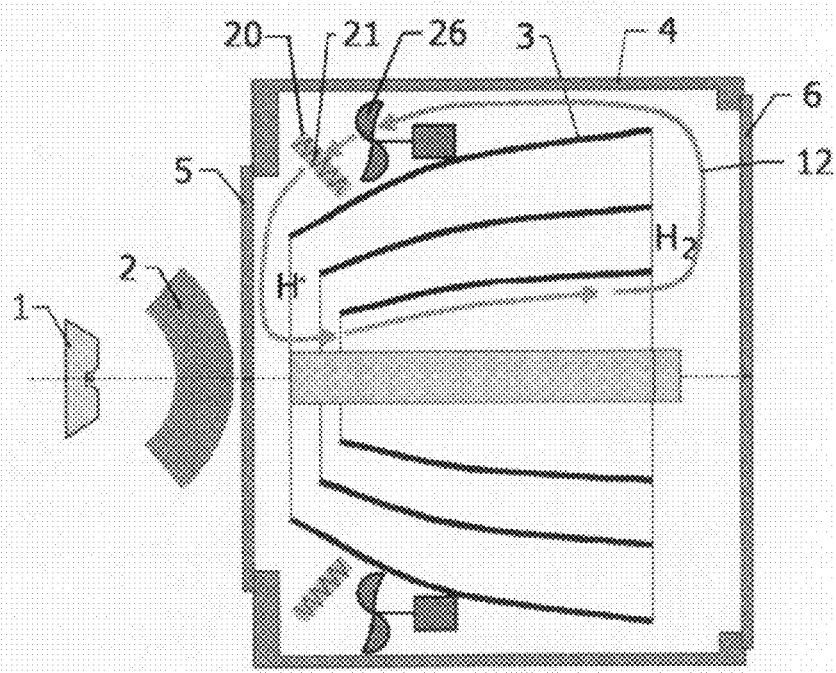

The following exemplary embodiments show examples of the present method and irradiation units with reference to the accompanying figures without limiting the scope of the invention. The figures show:

FIG. 1 a schematic configuration of a first part of an EUV irradiation unit;

FIG. 2 a schematic view of a first arrangement for the generation of radicals used to clean the collector of an EUV-irradiation unit;

FIG. 3 a schematic view of a second arrangement for the generation of radicals used to clean the collector of an EUV-irradiation unit;

FIG. 4 a schematic view of a third arrangement for the generation of radicals used to clean the collector of an EUV-irradiation unit;

FIG. 5 a schematic view of a fourth arrangement for the generation of radicals used to clean the collector of an EUV-irradiation unit;

FIG. 6 a schematic view of a fifth arrangement for the generation of radicals used to clean the collector of an EUV-irradiation unit;

FIG. 7 a detail showing the delivery of radicals through an optical component;

FIG. 8 a schematic view of a sixth arrangement for the generation of radicals used to clean the collector of an EUV-irradiation unit;

FIG. 9 a schematic view of a seventh arrangement for the generation of radicals used to clean the collector of an EUV-irradiation unit;

FIG. 10 a schematic view of a eighth arrangement for the generation of radicals used to clean the collector of an EUV-irradiation unit;

FIG. 11 a schematic view of a ninth arrangement for the generation of radicals used to clean the collector of an EUV-irradiation unit;

FIG. 12 a schematic view showing the generating of radicals by use of an additional UV-lamp in an EUV irradiation unit;

FIG. 13 a first schematic view showing the generation of an individual gas stream for each collector shell of an EUV irradiation unit;

FIG. 14 a second schematic view showing the generation of an individual gas stream for each collector shell of an EUV irradiation unit;

FIG. 15 a third schematic view showing the generation of an individual gas stream for each collector shell of an EUV irradiation unit;

FIG. 16 a fourth schematic view showing the generation of an individual gas stream for each collector shell of an EUV irradiation unit;

FIG. 17 a schematic view showing the generation and delivering of radicals through a collector separated in two parts in an EUV irradiation unit;

FIG. 18 a schematic view showing the generation of radicals as well as circulation units for recycling the radicals within the volume to be cleaned in an EUV irradiation unit; and FIG. 19 an example for the different steps of the present method for cleaning optical surf-aces in an EUV irradiation unit.

A typical construction of a first part of an EUV irradiation unit has already been described in the introductory portion of the present description with respect to FIG. 1. In the following FIGS. 2 to 19 this first part of such an EUV irradiation unit with the EUV-radiation source 1, a foil trap 2 for debris mitigation, the collector mirror 3 as well as the wall 4 of the vacuum chamber are shown. FIG. 2 demonstrates the generation of radicals in the pretreatment step of the present method using hydrogen as a pretreatment gas. Prior to the pretreatment step the cleaning volume is closed by two mechanical closing elements 5, 6 to separate the cleaning volume from the radiation source 1 and the second part of the irradiation unit containing highly sensitive optical components. Then the hydrogen gas is delivered through the gas inlet passage 10 into this cleaning volume containing the collector mirror 3. The direction of gas flow 12 through the collector shells is indicated by the arrows. The pretreatment gas after reacting with the contaminations on the optical surfaces of the collector 3 leaves the cleaning volume through gas outlet passage 11. In order to generate a sufficient portion of radicals, i.e. atomic hydrogen, a unit 20 for generating these radicals from molecular hydrogen is included in the gas inlet passage 10.

FIG. 3 shows a further embodiment in which compared to the example of FIG. 2 two gas inlet passages 10 with corresponding units 20 for radical generation are shown. With this embodiment the mean transport distance of the radicals from the generation unit to the optical surfaces is reduced compared with the embodiment of FIG. 2.

FIG. 4 shows a further embodiment using several gas inlet passages 10 with corresponding units 20 for radical generation as well as several gas outlet passages 11. It goes without saying that the number of gas inlet passages and gas outlet passages can also be more than two, which are in particular radially distributed around the cleaning volume normally having a cylindrical form The flow direction 12 in the example of FIG. 4 is in the opposite direction to the flow direction 12 of FIGS. 2 and 3.

FIG. 5 shows an embodiment of the present invention, in which one or several glass tubes 13 are used to directly bring the radicals generated in the generation unit 20 close to the optical surfaces. The glass walls of the glass tube 13 allow the transport of radicals over longer distances than for example metallic tubes.

It is also possible to use a movable delivery tube 27 to transport the radicals close to the surfaces of the optical elements. With this movable delivery tube 27 shown in FIG. 6 the outlet opening (distribution unit 14) can be moved along the optical surfaces to be cleaned as shown with the double arrow in FIG. 6.

A further possibility to bring the radicals close to the optical surfaces is shown in FIG. 7. This figure shows a part of a collector shell of collector mirror 3. In this embodiment the collector shells are made of a hollow body with outlet openings 15 on the side of the optical surfaces to be cleaned. With such a construction the radicals can be directly supplied through these outlet openings 15. The collector shells can also be made of a porous material for the same purpose.

FIG. 8 shows an embodiment in which the generation unit 20 for generation of the radicals is integrated in mechanical closing element 6. In the present, the previous and the following embodiments the generation unit 20 is preferably formed of thin heatable filaments, e.g. metallic wires. Nevertheless, generation unit 20 can also be designed to produce a discharge for radical generation.

FIG. 9 shows an embodiment in which unit 20 for radical generation is arranged close to the collector mirror 3. The unit 20 for radical generation in this example is formed by very thin hot filaments 21 which do not disturb the optical path of the EUV-radiation in the normal operation of the irradiation unit.

FIG. 10 shows a further embodiment in which the generation units 20, in this case also hot filaments 21, are arranged in optical shadow regions of the collector shells of the collector 3. The optical path 7 of the EUV-radiation in the normal operation mode of the irradiation unit is also shown.

FIG. 11 shows a further embodiment in which the hot filaments 21 forming the generation unit 20 for the radicals are mounted directly on the small front sides of the collector shells. In this position, the hot filaments 21 do not disturb the optical path of the EUV-radiation.

FIG. 12 shows an embodiment of the present method in which the radicals are generated using UV-lamps 22 illuminating the back sides of the collector shells. On these back sides of the collector shells a phosphor layer 24 is applied which generates secondary radiation 25 impinging on the optical surfaces for generating the radicals close to these optical surfaces. With such an arrangement the UV-lamps do not disturb the optical path of the EUV-radiation.

FIGS. 13 to 17 show embodiments for mechanical means to achieve a homogeneous or otherwise predefined distribution of the gas flow over the optical surfaces. In FIG. 13 this distribution is achieved with a distribution unit 14 integrated in the closing element 5. The distribution unit 14 has different inlet openings 15 of different sizes of the individual gaps between the collector shells of the collector mirror 3. These openings 15 of the distribution unit 14 are adapted to the distances and flow resistances between the individual shells in order to achieve a predefined distribution of gas flow through the shells. In this embodiment it is possible to achieve very similar flow resistances for all flow paths through the collector mirror 3, which results in an homogeneous flow through all the portions of this collector mirror. It goes without saying that this embodiment also allows the control of the flow conditions through the collector mirror 3, for example in order to apply special portions with higher gas flow than other portions. The main objective of these embodiments is to achieve a predefined transport depth for the radicals in each of the gaps between the shells. This predefined transport depth can be the same for each gap or can be different for different gaps depending on the required cleaning depth in the gap.

A further possibility to achieve such an individual gas flow through the collector shells is shown in FIG. 14. In this figure, a perforated membrane 16 is used, which attaches to the front part of the collector mirror 3 in the case of a gas flow. Through the diameter of the openings 15 in the membrane 16 the gas flow for the individual gaps between the collector shells can be controlled. This allows achieving the same effects as in the embodiment of FIG. 13.

As an alternative it is also possible to form the membrane 16 from a multiplicity of flexible tubes which enter in the gaps between the shells of the collector when applied with a gas stream. This allows a further a distribution of the gas flow in the different regions of the collector mirror 3.

FIG. 15 shows a further embodiment for controlling the gas flow in the collector mirror 3. In this embodiment one part of the distribution unit 14 with inlet openings 15 is part of the closing element 5. On the outlet side of the collector mirror 3 a second part of the distribution unit 14, i.e. faceplate 17, for controlling the gas flow is applied which has outlet openings 15 of different sizes in order to control the flow resistance for the individual gaps between the shells and therefore the distribution of the gas flow as already explained in connection with FIG. 13. In this embodiment the generation of radicals is made using filaments 21 integrated in the closing element 5. The faceplate 17 in this figure comprises separating walls 18, which allow the direct contact between the faceplate 17 and the shells of the collector mirror 3 and at the same time inhibit an overflow between the individual flow paths in the shell gaps.

FIG. 16 shows a similar embodiment to FIG. 15 with the main difference that a mechanical shutter, shown as movable iris aperture 19, is arranged on the outlet side of the collector mirror 3 in order to control the individual gas flow through the collector gaps. Different regions of the collector mirror 3 are released for the gas flow one after the other by stepwise or continuously opening this movable aperture 19. In this embodiment it is possible to concentrate the flow of the gas for a specific time on regions with a high flow resistance which otherwise would not be passed through enough. With this embodiment it is also possible to control the flow conditions in time independently of the geometry of the optical component. Furthermore, it is possible to prefer special portions of the optical component for the gas flow.

FIG. 17 shows a further embodiment in which the gas flow is individually set for each collector gap by a gas inlet in the central portion of the optical component. To this end the optical component, in the present case the collector mirror 3, is separated in two parts with the distribution unit 14 arranged in between.

FIG. 18 shows a further embodiment in which circulation units 26 are arranged within the cleaning volume. With these circulation units 26 it is possible to recycle the pretreatment or cleaning gases by newly activating radicals with the filaments 21 of the generating units 20 within the cleaning volume. It is also possible to arrange the circulation units 26 outside the cleaning volume in connection with the gas inlet and outlet passages for the same purpose.

FIG. 19 shows different steps which are performed in an embodiment of the present method for cleaning the optical surfaces of the collector mirror 3 of an EUV irradiation unit. FIG. 19a shows the normal operation of the irradiation unit when the radiation source 1 is in operation and the collector mirror 3 collects and focuses the generated EUV-radiation. When the optical surfaces must be cleaned the mechanical closing element 6 for separating the first part of this irradiation unit from the second part are closed (FIG. 19b). FIG. 19c shows the moving of the collector mirror 3 towards the closing element 6 (identical to faceplate 17 in FIG. 15) in order to achieve the direct contact of the separating walls of the closing element 6 with the collector mirror. Then the closing element 5 for separating the cleaning volume from the EUV-radiation source 1 and the debris mitigating unit 2 is closed (FIG. 19d). FIG. 19e shows the closed cleaning volume. Then the pretreatment step and the cleaning step can be performed one after the other by delivering the pretreatment and the cleaning gases as schematically shown in FIG. 6. After the two-steps which are not shown explicitly in this figure the original state of the irradiation unit is prepared by performing the steps of FIGS. 19a to 19e in reverse direction. Then the normal operation of the irradiation unit can start again.

LIST OF REFERENCE SIGNS

1 EUV-radiation source
2 foil trap for debris mitigation
3 collector mirror
4 wall of the vacuum chamber
5 mechanical closing element
6 mechanical closing element
7 optical path
10 gas inlet passage
11 gas outlet passage
12 direction of gas flow
13 glass tube
14 unit for gas distribution
15 inlet/outlet openings
16 membrane
17 faceplate
18 separating walls
19 movable aperture
20 unit for radical generation
21 hot filament
22 UV-amp
23 radiation
24 phosphor layer
25 secondary radiation
26 circulation unit
27 movable delivery tube
31 radiation source
32 vacuum vessel
33 collector
34 tube to pump
35 intermediate focus
36 optical path
37 means for debris mitigation

The invention claimed is:

1. Method of cleaning optical surfaces in an irradiation unit for EUV-radiation in order to remove contaminations deposited on said optical surfaces, the method including a cleaning step in which a first gas or gas mixture is brought into contact with said optical surfaces thereby forming a volatile compound with a first portion of said contaminations, wherein in an operation pause of the irradiation unit for EUV-radiation prior to the cleaning step, a pretreatment step is performed, in which a second gas or gas mixture is brought into contact with said optical surfaces, wherein said second gas or gas mixture is selected to react with a second portion of said contaminations different from said first portion to form a reaction product, which is able to form a volatile compound with said first gas or gas mixture, wherein after the cleaning step residues still remaining on the optical surfaces are removed from said optical surfaces or converted into compounds less absorbing radiation of the irradiation unit by a treatment with a third gas or gas mixture.

2. Method according to claim 1, characterized in that in the pretreatment step gases or vapors having a reducing effect are used as said second gas or gas mixture.

3. Method according to claim 1, characterized in that atomic and/or molecular hydrogen and/or hydrogen compounds containing gases are used as said second gas or gas mixture.

4. Method according to claim 1, characterized in that in the cleaning step hydrogen containing gases and/or halogens and/or halogen compounds containing gases and/or corresponding radicals are used as said first gas or gas mixture.

5. Method according to claim 1, characterized in that after the cleaning step reaction products and residues of said first and/or second gases or gas mixtures or volatile compounds are pumped out while heating said optical surfaces and/or while flushing the irradiation unit with an inert gas.

6. Method according to claim 1, characterized in that after the cleaning step a preparation step is performed by applying molecular hydrogen to said optical surfaces.

7. Method according to claim 1, characterized in that at the beginning of the pretreatment step a volume containing said optical surfaces is separated from at least one other part of the irradiation unit by one or several mechanical closing elements (5, 6).

8. Method according to claim 1, characterized in that at least said second gas or gas mixture contains radicals which are generated using hot surfaces (21) or electrical discharges within the irradiation unit or within delivery passages (10) of the second gas or gas mixture.

9. Method according to claim 8, characterized in that said radicals are generated using hot surfaces (21) arranged outside an optical path (7) of said irradiation unit.

10. Method according to claim 8, characterized in that said radicals are generated using hot surfaces (21) arranged at or integrated in the mechanical closing element(s) (5, 6).

11. Method according to claim 1, characterized in that at least said second gas or gas mixture contains radicals which are generated by irradiation with UV-radiation.

12. Method according to claim 1, characterized in that said first and/or second gas or gas mixture is delivered through one or several delivery tubes (13, 27) which extend close to the optical surfaces.

13. Method according to claim 1, characterized in that said first and/or second gas or gas mixture is delivered through one or several delivery tubes (13, 27) movable in the irradiation unit, wherein the tubes (13, 27) are moved along said optical surfaces or optical components (3) comprising said optical surfaces during the delivery of said first and/or second gas or gas mixture.

14. Method according to claim 12, characterized in that said one or several delivery tubes (13, 27) are made of a material causing a low loss of radicals or are coated inside with such a material.

15. Method according to claim 7, characterized in that said first and/or second gas or gas mixture is delivered through delivery passages of said mechanical closing element (5, 6).

16. Method according to claim 1, characterized in that said first and/or second gas or gas mixture is delivered through a gas distribution unit (14) comprising several inlet and/or outlet openings (15) close to said optical surfaces and made of a material causing a low loss of radicals or coated inside with such a material.

17. Method according to claim 16, characterized in that a flow distribution of said first and/or second gas or gas mixture in the irradiation unit is controlled by selecting appropriate diameters of said inlet and/or outlet openings (15) of said gas distribution unit (14).

18. Method according to claim 1, characterized in that said first and/or second gas or gas mixture is delivered through passages in said optical surfaces and/or optical components (3) comprising said optical surfaces.

19. Method of cleaning optical surfaces in an irradiation unit in order to remove contaminations deposited on said optical surfaces, the method including a cleaning step in which a first gas or gas mixture is brought into contact with said optical surfaces thereby forming a volatile compound with a first portion of said contaminations, wherein in an operation pause of the irradiation unit for EUV-radiation prior to the cleaning step, a pretreatment step is performed, in which a second gas or gas mixture is brought into contact with said optical surfaces, wherein said second gas or gas mixture is selected to react with a second portion of said contaminations different from said first portion to form a reaction product, which is able to form a volatile compound with said first gas or gas mixture, wherein said first and/or second gas or gas mixture is delivered through a gas distribution unit (14) comprising several inlet and/or outlet openings (15) close to said optical surfaces and made of a material causing a low loss of radicals or coated inside with such a material and wherein said optical surfaces are brought into contact with said first and/or second gas or gas mixture in a time-dependent order by using one or several mechanical shutters (19) for opening or closing said inlet and/or outlet openings (15).

* * * * *